United States Patent
Kim et al.

(10) Patent No.: US 11,367,850 B2
(45) Date of Patent: Jun. 21, 2022

(54) ELECTROLUMINESCENT DISPLAY DEVICE

(71) Applicant: LG Display Co., Ltd., Seoul (KR)

(72) Inventors: Pureum Kim, Paju-si (KR); Wooram Youn, Paju-si (KR); YoungMi Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 91 days.

(21) Appl. No.: 16/704,284

(22) Filed: Dec. 5, 2019

(65) Prior Publication Data

US 2020/0194705 A1  Jun. 18, 2020

(30) Foreign Application Priority Data

Dec. 13, 2018 (KR) .................. 10-2018-0161125

(51) Int. Cl.
*H01L 27/32* (2006.01)
*H01L 51/50* (2006.01)
*H01L 51/52* (2006.01)

(52) U.S. Cl.
CPC ........ *H01L 51/5044* (2013.01); *H01L 27/322* (2013.01); *H01L 27/3246* (2013.01); *H01L 51/5275* (2013.01)

(58) Field of Classification Search
CPC .. H01L 27/32; H01L 27/3244; H01L 27/3206
See application file for complete search history.

(56) References Cited

U.S. PATENT DOCUMENTS

| | | | |
|---|---|---|---|
| 2011/0108812 A1* | 5/2011 | Sumita | H01L 27/326 257/40 |
| 2013/0140533 A1* | 6/2013 | Lee | H01L 27/3218 257/40 |
| 2014/0247200 A1* | 9/2014 | Jinta | G09G 3/3225 345/76 |
| 2016/0343776 A1* | 11/2016 | Heo | H01L 51/5072 |
| 2017/0222173 A1* | 8/2017 | Matsusue | H01L 51/56 |
| 2019/0103442 A1* | 4/2019 | Choi | H01L 51/5225 |
| 2020/0176702 A1* | 6/2020 | Hou | H01L 51/5215 |

FOREIGN PATENT DOCUMENTS

KR    10-2018-003967 A    1/2018

* cited by examiner

*Primary Examiner* — Michele Fan
(74) *Attorney, Agent, or Firm* — Morgan, Lewis & Bockius LLP

(57) ABSTRACT

An electroluminescent display device includes a substrate including a first sub pixel, a second sub pixel, and a third sub pixel, a first electrode in each of the first to third sub pixels on the substrate, an emission layer on the first electrode, and a second electrode on the emission layer, wherein the first sub pixel is provided with a first emission area including a first sub emission area and a second sub emission area, and the first sub emission area is configured to emit mixed light of first colored light and second colored light, wherein the second colored light is different from the first colored light, and the second sub emission area is configured to emit the second colored light.

16 Claims, 10 Drawing Sheets

ELECTROLUMINESCENT DISPLAY DEVICE

CROSS-REFERENCE TO RELATED APPLICATIONS

This application claims the benefit of the Korean Patent Application No. 10-2018-0161125 filed on Dec. 13, 2018, which is hereby incorporated by reference as if fully set forth herein.

BACKGROUND

Technical Field

The present disclosure relates to an electroluminescent display device, and more particularly, to an electroluminescent display device configured to emit white colored light.

Discussion of the Related Art

An electroluminescent display device is provided in such a way that an emission layer is provided between an anode electrode and a cathode electrode, and the emission layer emits light by an electric field generated between the above two electrodes, to thereby display an image.

The emission layer may be formed of an organic material which emits light when exciton is produced by a bond of electron and hole, and the exciton falls to a ground state from an excited state, or may be formed of an inorganic material such as quantum dot.

The emission layer may emit the different colored light by each sub pixel, for example, red colored light, green colored light or white colored light by each sub pixel, or may emit the same colored light by each sub pixel, for example, white colored light by each sub pixel.

If the emission layer emits the different colored light by each sub pixel, a different colored emission layer has to be deposited by each sub pixel through the use of predetermined mask. In this case, it has limitations on the increase of mask process. Also, if a mask is not aligned precisely, it is difficult to accurately deposit the emission layer by each sub pixel.

In contrast, if the emission layer emits the same colored light by each pixel, for example, white colored light by each sub pixel, there is no need for a mask configured to pattern the emission layer, whereby any problem caused by a mask process is not generated.

However, in the method of forming the emission layer configured to emit the white colored light, a predetermined color filter layer has to be patterned by each sub pixel. Thus, while the white colored light passes through the color filter layer, only light with a predetermined wavelength is emitted so that a light efficiency is deteriorated.

SUMMARY

Accordingly, embodiments of the present disclosure are directed to an electroluminescent display device that substantially obviates one or more problems due to limitations and disadvantages of the related art.

An aspect of the present disclosure is to provide an electroluminescent display device which is capable of improving a light efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescent display device comprises a substrate including a first sub pixel, a second sub pixel, and a third sub pixel, a first electrode in each of the first to third sub pixels on the substrate, an emission layer on the first electrode, and a second electrode on the emission layer, wherein the first sub pixel is provided with a first emission area including a first sub emission area and a second sub emission area, and the first sub emission area is configured to emit mixed light of first colored light and second colored light, wherein the second colored light is different from the first colored light, and the second sub emission area is configured to emit the second colored light.

In another aspect, an electroluminescent display device comprises a substrate including a first sub pixel, a second sub pixel, and a third sub pixel, a first electrode in each of the first to third sub pixels on the substrate, an emission layer on the first electrode, and a second electrode on the emission layer, wherein the first sub pixel is provided with a first emission area including a first sub emission area and a second sub emission area, and the first sub emission area and the second sub emission area are configured such that an electric field is formed between the second electrode and the first electrode in the first sub emission area and an electric field is not formed between the second electrode and the first electrode in the second sub emission area.

According to one embodiment of the present disclosure, the first emission area provided in the first sub pixel includes the second sub emission area configured to emit only the light which is the same as the light emitted from the first sub pixel so that it is possible to increase an amount of light emitted from the first sub pixel, to thereby improve a light efficiency.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION OF THE DISCLOSURE

Figure 1:
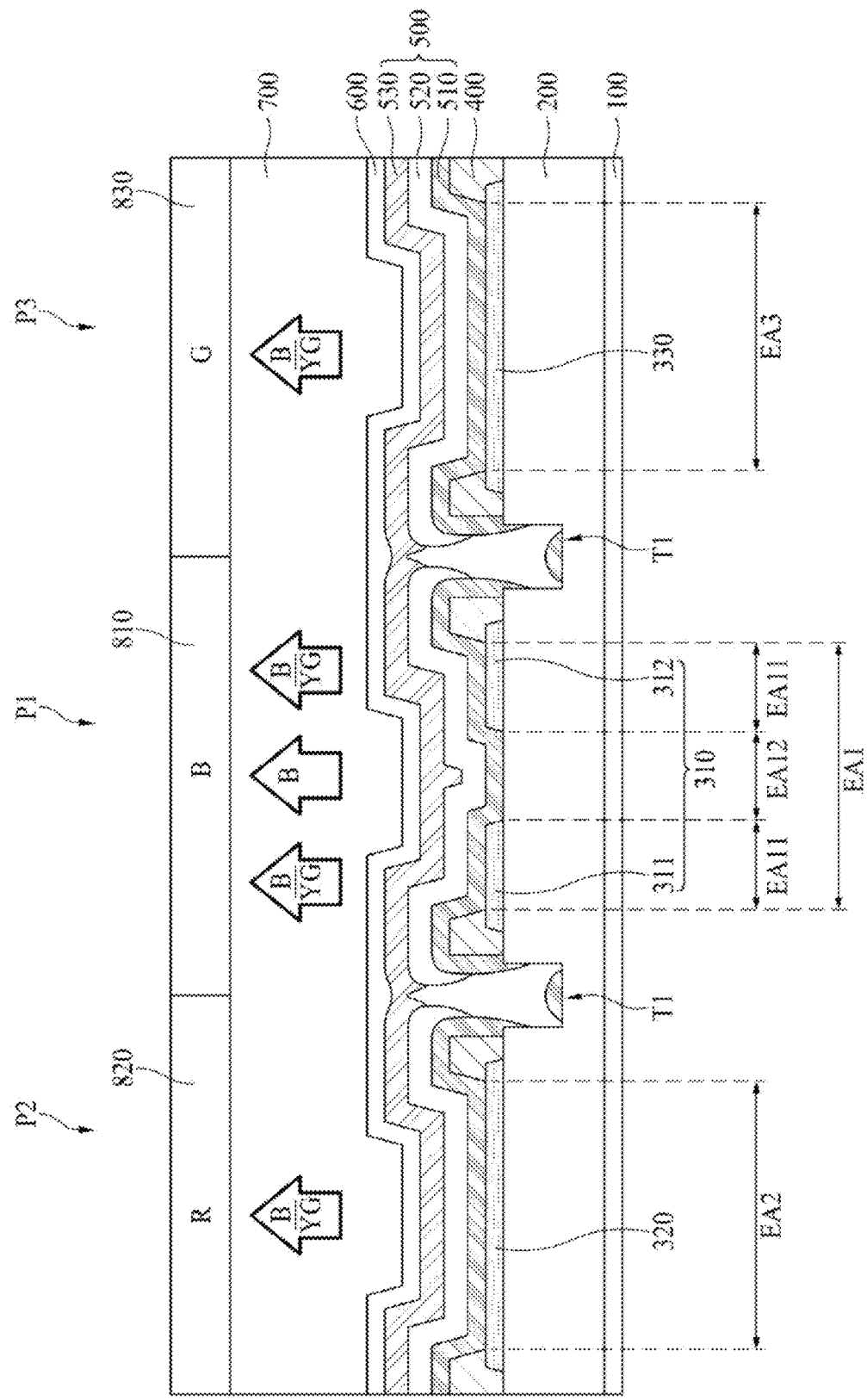
FIG. 1 is a schematic cross sectional view illustrating an electroluminescent display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a schematic cross sectional view illustrating an electroluminescent display device according to one embodiment of the present disclosure.

As shown in FIG. 1, the electroluminescent display device according to one embodiment of the present disclosure includes a substrate 100, a circuit device layer 200, a first electrode 310, 320 and 330, a bank 400, an emission layer 500, a second electrode 600, an encapsulation layer 700, and a color filter layer 810, 820 and 830.

The substrate 100 may be formed of glass or plastic, but not limited to these materials. The substrate 100 may be formed of a semiconductor material such as silicon wafer. The substrate 100 may be formed of a transparent material or an opaque material. On the substrate 100, there are a first sub pixel (P1), a second sub pixel (P2) disposed at one side of the first sub pixel (P1), and a third sub pixel (P3) disposed at the other side of the first sub pixel (P1). The first sub pixel (P1) emits blue (B) colored light, the second sub pixel (P2) emits red (R) colored light, and the third sub pixel (P3) emits green (G) colored light, but not limited to this structure. For example, an arrangement order of the respective sub pixels (P1, P2, P3) may be changed in various ways.

The electroluminescent display device according to one embodiment of the present disclosure may be formed in a top emission type where emitted light advances upwardly, but not limited to this type. If the electroluminescent display device is formed in the top emission type, the substrate 100 may be formed of an opaque material as well as a transparent material.

The circuit device layer 200 is provided on the substrate 100.

In the circuit device layer 200, a circuit device comprising various signal lines, thin film transistors, and a capacitor is provided by each sub pixel (P1, P2, P3). The signal lines may include a gate line, a data line, a power line and a reference line, and the thin film transistors may include a switching thin film transistor, a driving thin film transistor and a sensing thin film transistor.

The switching thin film transistor is switched by a gate signal supplied to the gate line, and the switching thin film transistor supplies a data voltage, which is supplied from the data line, to the driving thin film transistor.

The driving thin film transistor is switched by the data voltage supplied from the switching thin film transistor, and the driving thin film transistor generates a data current from power source supplied from the power line, and supplies the data current to the first electrode 310, 320 and 330.

The sensing thin film transistor senses a deviation of threshold voltage in the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period, and the capacitor is connected with each of gate and source terminals of the driving thin film transistor.

Although not shown in detail, a passivation layer and a planarization layer may be additionally included in the circuit device layer 200. The passivation layer is formed on the signal lines, the thin film transistors, and the capacitor, to thereby protect the aforementioned signal lines, the thin film transistors, and the capacitor. The planarization layer is formed on the passivation layer, to thereby planarize a surface of the substrate 100.

The first electrode 310, 320 and 330 is provided on the circuit device layer 200, and is patterned by each sub pixel (P1, P2, P3). One of the first electrode 310 is formed in the first sub pixel (P1), another first electrode 320 is formed in the second sub pixel (P2), and another first electrode 330 is formed in the third sub pixel (P3). The first electrode 310, 320 and 330 is connected with the source terminal or drain terminal of the driving thin film transistor provided by each sub pixel (P1, P2, P3) in the circuit device layer 200.

The first electrode 310 of the first sub pixel (P1) includes a first sub electrode 311 and a second sub electrode 312. The first sub electrode 311 is provided at one side of the first sub pixel (P1), the second sub electrode 312 is provided at the other side of the first sub pixel (P1), and the first sub electrode 311 and the second sub electrode 312 are provided at a predetermined interval from each other.

Meanwhile, the first electrode 320 of the second sub pixel (P2) is formed as one body with the second sub pixel (P2), and the first electrode 330 of the third sub pixel (P3) is formed as one body with the third sub pixel (P3).

The electroluminescent display device according to one embodiment of the present disclosure is formed in the top emission type. To this end, the first electrode 310, 320 and 330 may upwardly reflect the light emitted from the emission layer 500. In this case, the first electrode 310, 320 and 330 may be formed in a double layered structure comprising a reflective electrode for reflecting the light, and a transparent electrode provided on the reflective electrode and configured to supply a hole to the emission layer 500. The transparent electrode may be formed on an upper surface of the reflective electrode, or may be formed above the reflective electrode with an insulating layer interposed in-between. The transparent electrode and the reflective electrode may be electrically connected with each other, or not. If the transparent electrode and the reflective electrode are not electrically connected with each other, the transparent electrode may be electrically connected with the source terminal or drain terminal of the driving thin film transistor.

The bank 400 is configured to cover both ends of the first electrode 310, 320 and 330 on the circuit device layer 200. Accordingly, it is possible to prevent a current from being concentrated into the ends of the first electrode 310, 320 and 330, to thereby prevent deterioration of emission efficiency.

The bank 400 is formed as a matrix configuration in the boundary between each of the plurality of sub pixels (P1, P2, P3), and is configured to define an emission area (EA11, EA12, EA2, EA3) in each individual sub pixel (P1, P2, P3). That is, an exposed area of the first electrode 310, 320 and 330, which is exposed without being covered by the bank 400 in each sub pixel (P1, P2, P3), becomes the emission area (EA11, EA12, EA2, EA3).

The emission area (EA11, EA12, EA2, EA3) may include a first emission area (EA11, EA12) provided in the first sub pixel (P1), a second emission area (EA2) provided in the second sub pixel (P2), and a third emission area (EA3) provided in the third sub pixel (P3).

The first emission area (EA11, EA12) includes a first sub emission area (EA11) and a second sub emission area (EA12). The first sub emission area (EA11) is overlapped with the first sub electrode 311 and the second sub electrode 312, and the second sub emission area (EA12) is overlapped with the spaced area between the first sub electrode 311 and the second sub electrode 312.

In the area of the first sub electrode 311, an electric field is formed between the first sub electrode 311 and the second electrode 600, whereby both a first stack 510 and a second stack 530 included in the emission layer 500 emit the light. According to one embodiment of the present disclosure, yellow green (YG) colored light is emitted from the first stack 510 of the emission layer 500, and blue (B) colored light is emitted from the second stack 530 of the emission layer 500. Accordingly, mixed light of the yellow green (YG) colored light and the blue (B) colored light may be emitted from the area of the first sub electrode 311.

Also, in the area of the second sub electrode 312, an electric field is formed between the second sub electrode 312 and the second electrode 600, whereby both the first stack 510 and the second stack 530 of the emission layer 500 emit the light. Accordingly, mixed light of yellow green (YG) colored light and blue (B) colored light may be emitted from the area of the second sub electrode 312.

Thus, in the first sub emission area (EA11) which is overlapped with the area of the first sub electrode 311 and the area of the second sub electrode 312, the mixed light obtained by mixing the yellow green (YG) colored light emitted from the first stack 510, and the blue (B) colored light emitted from the second stack 530 may be emitted.

Meanwhile, in the spaced area between the first sub electrode 311 and the second sub electrode 312, the first electrode 310 is not provided so that an electric field is not formed between the first electrode 310 and the second electrode 600. However, a current, which flows in a charge generating layer 520 inside the emission layer 500 of the first sub emission area (EA11), flows into the spaced area between the first sub electrode 311 and the second sub electrode 312, whereby an electric field may be generated between the charge generating layer 520 and the second electrode 600 in the spaced area between the first sub electrode 311 and the second sub electrode 312. Thus, the blue (B) colored light may be emitted from the second stack 530 of the emission layer 500 in the spaced area between the first sub electrode 311 and the second sub electrode 312.

Accordingly, in the second sub emission area (EA12) which is overlapped with the spaced area between the first sub electrode 311 and the second sub electrode 312, the blue (B) colored light is emitted from the second stack 520.

Thus, according to one embodiment of the present disclosure, the first emission area (EA11, EA12) provided in the first sub pixel (P1) includes the first sub emission area (EA11) configured to emit the light which is the same as the light emitted from the first sub pixel (P1), for example, the blue (B) colored light, together with the light which is different from the light emitted from the first sub pixel (P1), for example, the yellow green (YG) colored light, and also includes the second sub emission area (EA12) configured to emit only the light which is the same as the light emitted from the first sub pixel (P1), for example, the blue (B)

colored light. Accordingly, an amount of the light emitted from the first sub pixel (P1) may be increased, to thereby improve a light efficiency.

In other words, according to one embodiment of the present disclosure, the first emission area (EA11, EA12) provided in the first sub pixel (P1) includes the second sub emission area (EA12) configured to emit only the blue (B) colored light. Thus, in comparison to a case in which all the first emission areas (EA11, EA12) emit the blue (B) colored light and the yellow green (YG) colored light, it is possible to improve a light efficiency and color purity. That is, the first sub emission area (EA11) makes both the first stack 510 of the yellow green (YG) color and the second stack 530 of the blue (B) color simultaneously emit the light at a predetermined voltage, however, the second sub emission area (EA12) makes the second stack 530 of the blue (B) color emit the light at the same predetermined voltage, whereby a blue (B) colored light emission efficiency in the second sub emission area (EA12) is relatively higher than a blue (B) colored light emission efficiency in the first sub emission area (EA11).

Also, in the second sub emission area (EA12), an electric field is not formed between the first electrode 310 and the second electrode 600, and an electric field is formed between the charge generating layer 520 and the second electrode 600, whereby a driving voltage is reduced, to thereby improve a power efficiency.

Meanwhile, the second emission area (EA2) is overlapped with the first electrode 320 of the second sub pixel (P2), and an electric field is generated between the first electrode 320 and the second electrode 600 in the second emission area (EA2), whereby both the first stack 510 and the second stack 530 of the emission layer 500 emit the light. Thus, the yellow green (YG) colored light emitted from the first stack 510 and the blue (B) colored light emitted from the second stack 520 may be emitted from the second emission area (EA2).

Also, the third emission area (EA3) is overlapped with the first electrode 330 of the third sub pixel (P3), and an electric field is generated between the first electrode 330 and the second electrode 600 in the third emission area (EA3), whereby both the first stack 510 and the second stack 530 of the emission layer 500 emit the light. Thus, the yellow green (YG) colored light emitted from the first stack 510 and the blue (B) colored light emitted from the second stack 520 may be emitted from the third emission area (EA3).

Meanwhile, according to one embodiment of the present disclosure, a first trench (T1) is formed in the boundary between the sub pixels (P1, P2, P3). In detail, the first trench (T1) may be formed in the bank 400 and the circuit device layer 200 therebelow. That is, the first trench (T1) may be formed in some areas of an upper portion of the circuit device layer 200, for example, a planarization layer while passing through the bank 400, but not limited to this structure. The first trench (T1) may be formed in some areas of an upper portion of the bank 400 without passing through the bank 400.

The first trench (T1) is formed in the boundary between the sub pixels (P1, P2, P3) so that the emission layer 500 may be formed inside the first trench (T1). Thus, a long current path is formed between the neighboring sub pixels (P1, P2, P3), to thereby reduce a leakage current generated between the neighboring sub pixels (P1, P2, P3). That is, on the assumption that an interval between the sub pixels (P1, P2, P3) becomes compact in order to realize a high resolution, if the emission layer 500 inside any one of the sub pixels (P1, P2, P3) emits the light, charges of the corresponding emission layer 500 may be transferred to another emission layer 500 of neighboring another sub pixel (P1, P2, P3), whereby there is a possibility of an occurrence of the leakage current.

Thus, according to one embodiment of the present disclosure, the first trench (T1) is formed in the boundary between the sub pixels (P1, P2, P3), and the emission layer 500 is formed in the first trench (T1) so that a resistance is increased due to the long current path formed between the neighboring sub pixels (P1, P2, P3), to thereby reduce an occurrence of the leakage current.

The emission layer 500 is formed on the first electrode 310, 320 and 330. The emission layer 500 may be formed on the bank 400. That is, the emission layer 500 is formed in the boundary between each of the plurality of sub pixels (P1, P2, P3). Also, the emission layer 500 is formed on an upper surface of the circuit device layer 200 in the area overlapped with the second sub emission area (EA12), whereby the emission layer 500 confronts one lateral surface of the first sub electrode 311 and one lateral surface of the second sub electrode 312.

The emission layer 500 is configured to emit white (W) colored light. To this end, the emission layer 500 may comprise a plurality of stacks configured to emit different colored light. In detail, the emission layer 500 may include a first stack 510, a second stack 530, and a charge generation layer (CGL) 520 disposed between the first stack 510 and the second stack 530.

The emission layer 500 is formed inside the first trench (T1), and also formed over the first trench (T1). As described above, as the emission layer 500 is formed inside the first trench (T1), the current path between the neighboring sub pixels (P1, P2, P3) becomes long so that the resistance is increased, to thereby reduce an occurrence of the leakage current.

Especially, the first stack 510 may be formed on an inner lateral surface of the first trench (T1), and may be formed on an inner lower surface of the first trench (T1). In this case, some area of the first stack 510 formed on the inner lateral surface of the first trench (T1) is disconnected from some area of the first stack 510 formed on the inner lower surface of the first trench (T1). Thus, some area of the first stack 510 formed on one lateral surface inside the first trench (T1), and more particularly, on the left lateral surface inside the first trench (T1) is not connected with some area of the first stack 510 formed on the other lateral surface inside the first trench (T1), and more particularly, on the right lateral surface inside the first trench (T1). Accordingly, charges are not transferred between the sub pixels (P1, P2, P3) with the first trench (T1) interposed in-between through the first stack 510.

Also, the charge generation layer 520 may be formed on the first stack 510 in the area overlapped with the first trench (T1). In this case, some area of the charge generating layer 520 formed at one side of the first trench (T1), and more particularly, at the left side of the first trench (T1) is not connected with some area of the charge generating layer 520 formed at the other side of the first trench (T1), and more particularly, at the right side of the first trench (T1). Accordingly, charges are not transferred between the sub pixels (P1, P2, P3) with the first trench (T1) interposed in-between through the charge generation layer 520.

Also, the second stack 530 may be provided connectedly between the neighboring sub pixels (P1, P2, P3) with the first trench (T1) interposed in-between while being disposed on the charge generating layer 520. Thus, charges are transferred between the sub pixels (P1, P2, P3) with the first trench (T1) interposed in-between through the second stack 530, but not limited to this structure. The second stack 530 may be provided disconnectedly between the neighboring sub pixels (P1, P2, P3) with the first trench (T1) interposed in-between by appropriately adjusting a shape of the first trench (T1) and a deposition process of the emission layer 500. Especially, some areas of a lower portion of the second stack 530 being adjacent to the charge generation layer 520 may be disconnectedly provided in the area between the sub pixels (P1, P2, P3). As shown in the drawings, the second stack 530 may have a groove-shaped cross sectional structure in the area corresponding to the first trench (T1).

Conductivity of the charge generating layer 520 is higher than that of each of the first stack 510 and the second stack 530. Especially, an N-type charge generating layer of the charge generating layer 520 may comprise a metal material, whereby conductivity of the charge generating layer 520 is higher than that of each of the first stack 510 and the second stack 530. Thus, the charge transfer between the sub pixels (P1, P2, P3) which are adjacent to each other is generally made through the charge generating layer 520, and the charge transfer through the second stack 530 is insignificant.

Thus, according to one embodiment of the present disclosure, when the emission layer 500 is formed inside the first trench (T1), some of the emission layer 500 is disconnectedly provided, especially, the first stack 510 and charge generating layer 520 are provided disconnectedly so that it is possible to reduce the charge transfer between the sub pixels (P1, P2, P3) which are disposed while being adjacent to each other, to thereby prevent the leakage current.

Meanwhile, as described above, in order to make the current, which flows in the charge generation layer 520 included in the emission layer 500 of the first sub emission area (EA11), flow into the spaced area between the first sub electrode 311 and the second sub electrode 312, the charge generation layer 520, and more particularly, the N-type charge generation layer has good conductivity. To this end, a concentration of dopant such as lithium (Li) included in the N-type charge generation layer is 10 weight % or more than 10 weight %, preferably. Also, if a concentration of the dopant is more than 15 weight %, it is difficult to perform an original function of the charge generation layer 520. Preferably, a concentration of the dopant is 15 weight % or less than 15 weight %.

The second electrode 600 is formed on the emission layer 500. The second electrode 600 may function as a cathode of the electroluminescent display device. In the same manner as the emission layer 500, the second electrode 600 is formed in each of the sub pixels (P1, P2, P3), and also formed in the boundary between the sub pixels (P1, P2, P3). As the second stack 530 is formed in the groove-shaped cross sectional structure in the area corresponding to the first trench (T1), the second electrode 600 formed on the second stack 530 is formed in a cross sectional structure corresponding to the groove-shaped cross sectional structure of the second stack 530 in the area corresponding to the first trench (T1).

The electroluminescent display device according to one embodiment of the present disclosure is formed in a top emission type, whereby the second electrode 600 may include a transparent conductive material capable of upwardly transmitting light emitted from the emission layer 500. Also, the second electrode 600 may be formed of a semi-transparent electrode so that it is possible to obtain a micro-cavity effect by each sub pixel (P1, P2, P3). If the second electrode 600 is formed of the semi-transparent electrode, the micro-cavity effect may be obtained by repetitive reflection and re-reflection of the light between the second electrode 600 and the first electrode 310, 320 and 330, to thereby improve a light efficiency.

The encapsulation layer 700 is formed on the second electrode 600, to thereby prevent external moisture from being permeated into the emission layer 500. The encapsulation layer 700 may be formed in a single-layered structure of an inorganic insulating material, or a deposition structure obtained by alternately depositing an inorganic insulating material and an organic insulating material, but not limited to these structures.

The color filter layer 810, 820 and 830 is formed on the encapsulation layer 700. The color filter layer 810, 820 and 830 may include a first color filter layer 810 provided in the first sub pixel (P1), a second color filter layer 820 provided in the second sub pixel (P2), and a third color filter layer provided in the third sub pixel (P3).

The first color filter layer 810 is formed of a blue (B) color filter, the second color filter layer 820 is formed of a red (R) color filter, and the third color filter layer 830 is formed of a green (G) color filter. Accordingly, only the light with the blue (B) wavelength from the yellow green (YG) colored light and the blue (B) colored light emitted from the first emission area (EA11, EA12) passes through the first color filter layer 810, only the light with the red (R) wavelength from the yellow green (YG) colored light and the blue (B) colored light emitted from the second emission area (EA2) passes through the second color filter layer 820, and only the light with the green (G) wavelength from the yellow green (YG) colored light and the blue (B) colored light emitted from the third emission area (EA3) passes through the third color filter layer 830.

Meanwhile, although not shown, a black matrix may be additionally provided between each of the color filters in the color filter layers 810, 820 and 830, to thereby prevent light from leaking in the boundary area between the sub pixels (P1, P2, P3).

In the above drawings, the yellow green (YG) colored light is emitted from the first stack 510, and the blue (B) colored light is emitted from the second stack 520, but not limited to this structure. The blue (B) colored light may be emitted from the first stack 510, and the yellow green (YG) colored light may be emitted from the second stack 520. In this case, green (G) or red (R) colored light may be emitted from the first sub pixel (P1).

Figure 2:
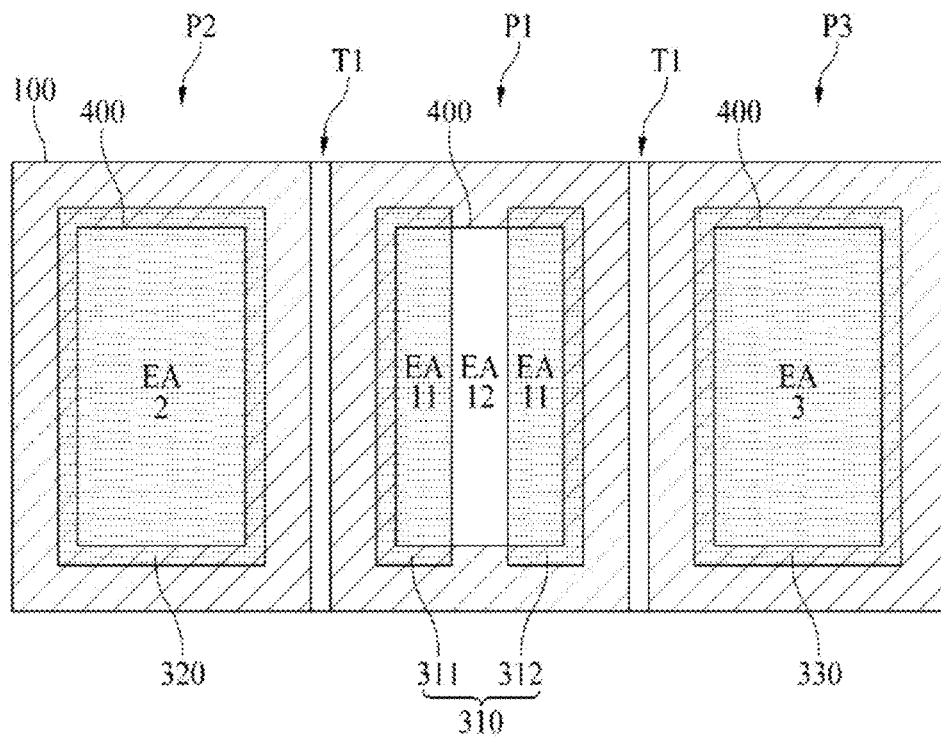
FIG. 2 is a schematic plane view illustrating the electroluminescent display device according to one embodiment of the present disclosure.

FIG. 2 is a schematic plane view illustrating the electroluminescent display device according to one embodiment of the present disclosure. For convenience of explanation, only the first electrode 310, 320 and 330, the bank 400, and the first trench (T1) provided on the substrate 100 are shown. Hereinafter, other plane views show only the first electrode 310, 320 and 330, the bank 400, and the first trench (T1) provided on the substrate 100.

As shown in FIG. 2, the first sub pixel (P1), the second sub pixel (P2), and the third sub pixel (P3) are provided on the substrate 100. The first emission area (EA11, EA12) is provided in the first sub pixel (P1), the second emission area (EA2) is provided in the second sub pixel (P2), and the third emission area (EA3) is provided in the third sub pixel (P3).

Also, the first electrode 310, 320 and 330 is individually patterned by each sub pixel (P1, P2, P3) on the substrate 100.

The first electrode 310 provided in the first sub pixel (P1) includes the first sub electrode 311 and the second sub electrode 312. The first sub electrode 311 and the second sub electrode 312 are provided at a predetermined interval from each other, and are separated from each other with the second sub emission area (EA12) interposed in-between. In this case, the same current signal has to be simultaneously applied to the first sub electrode 311 and the second sub electrode 312. Thus, the first sub electrode 311 and the second sub electrode 312 are connected with the source terminal or drain terminal of the driving thin film transistor in the first sub pixel (P1).

The first sub electrode 311 and the second sub electrode 312 are overlapped with the first sub emission area (EA11), and the spaced area between the first sub electrode 311 and the second sub electrode 312 is overlapped with the second sub emission area (EA12). The first sub emission area (EA11) corresponds to some area which is not overlapped with the bank 400 in the areas of the first sub electrode 311 and the second sub electrode 312, and the second sub emission area (EA12) corresponds to some area which is not overlapped with the bank 400 in the spaced area between the first sub electrode 311 and the second sub electrode 312.

The first electrode 320 provided in the second sub pixel (P2) is overlapped with the second emission area (EA2), and the first electrode 330 provided in the third sub pixel (P3) is overlapped with the third emission area (EA3). The second emission area (EA2) corresponds to some area which is not overlapped with the bank 400 in the area of the first electrode 320. The third emission area (EA3) corresponds to some area which is not overlapped with the bank 400 in the area of the first electrode 330.

The bank 400 is formed in the remaining areas except the first emission area (EA11, EA12), the second emission area (EA2), and the third emission area (EA3).

The bank 400 is provided to cover the periphery of the first electrode 310, 320 and 330. In detail, the bank 400 is provided to cover upper, lower, and left sides of the first sub electrode 311 of the first sub pixel (P1), but not to cover a right side of the first sub electrode 311 of the first sub pixel (P1), and the bank 400 is provided to cover upper, lower, and right sides of the second sub electrode 312 of the first sub pixel (P1), but not to cover a left side of the second sub electrode 312 of the first sub pixel (P1), to thereby define the first sub emission area (EA11) and the second sub emission area (EA12).

Also, the bank 400 is provided to cover upper, lower, left, and right sides of the first electrode 320 of the second sub pixel (P2), to thereby define the second emission area (EA2). Also, the bank 400 is provided to cover upper, lower, left, and right sides of the first electrode 330 of the third sub pixel (P3), to thereby define the third emission area (EA3).

The bank 400 is provided with the first trench (T1) disposed in the boundary between the first sub pixel (P1) and the second sub pixel (P2) and the boundary between the second sub pixel (P2) and the third sub pixel (P3).

The first trench (T1) is formed in a straight-line structure along the boundary between the sub pixels (P1, P2, P3). That is, the first trench (T1) is formed in a consecutive straight-line structure along an up-and-down direction. Although not shown, a unit pixel comprising the sub pixels (P1, P2, P3) may be arranged in the up-and-down direction, wherein the first trench (T1) may be provided in the boundary between each of the unit pixels. In this case, the first trench (T1) may be provided as a mesh configuration.

Figure 3:
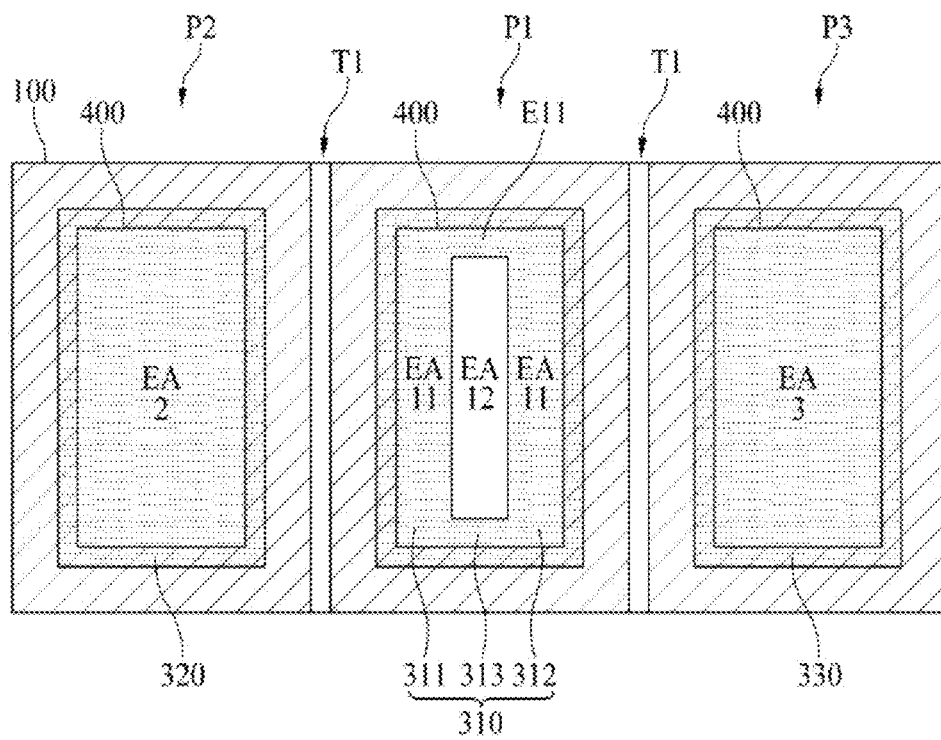
FIG. 3 is a schematic plane view illustrating an electroluminescent display device according to another embodiment of the present disclosure.

FIG. 3 is a schematic plane view illustrating an electroluminescent display device according to another embodiment of the present disclosure. A third sub electrode 313 is additionally provided in the electroluminescent display device of FIG. 3, whereby the electroluminescent display device of FIG. 3 is different from the electroluminescent display device of FIG. 2. Thus, hereinafter, only the different parts will be described in detail as follows.

Referring to FIG. 3, a first electrode 310 provided in a first sub pixel (P1) includes a first sub electrode 311, a second sub electrode 312, and a third sub electrode 313.

The first sub electrode 311 and the second sub electrode 312 are not separated from each other, and are connected with each other through the use of third sub electrode 313. That is, the third sub electrode 313 is connected with each of the first sub electrode 311 and the second sub electrode 312. The third sub electrode 313 is connected with a lower end of each of the first sub electrode 311 and the second sub electrode 312, and is also connected with an upper end of each of the first sub electrode 311 and the second sub electrode 312, but not limited to this structure. The third sub electrode 313 may be connected with any one of the lower end and the upper end in each of the first sub electrode 311 and the second sub electrode 312.

As described above, the first sub electrode 311, the second sub electrode 312, and the third sub electrode 313 are connected with one another. Thus, even though any one among the first sub electrode 311, the second sub electrode 312, and the third sub electrode 313 is connected with a source terminal or drain terminal of a driving thin film transistor in the first sub pixel (P1), it is possible to apply the same current signal to the first sub electrode 311, the second sub electrode 312, and the third sub electrode 313, at the same time.

The first sub electrode 311, the second sub electrode 312, and the third sub electrode 313 are overlapped with a first sub emission area (EA11), and a spaced area between the first sub electrode 311 and the second sub electrode 312, and more particularly, an area surrounded by the first sub electrode 311, the second sub electrode 312, and the third sub electrode 313 is overlapped with a second sub emission area (EA12).

That is, the area which is provided with the sub electrode 311, 312 and 313 is overlapped with the first sub emission area (EA11), and the area which is not provided with the sub electrode 311, 312 and 313 is overlapped with the second sub emission area (EA12).

A bank 400 is provided to cover upper, lower, and left sides of the first sub electrode 311, to cover upper, lower, and right sides of the second sub electrode 312, to cover a lower side of the third sub electrode 313 connected with the lower end of each of the first sub electrode 311 and the second sub electrode 312, and to cover an upper side of the third sub electrode 313 connected with the upper end of each of the first sub electrode 311 and the second sub electrode 312, to thereby define the first sub emission area (EA11) and the second sub emission area (EA12).

Figure 4:
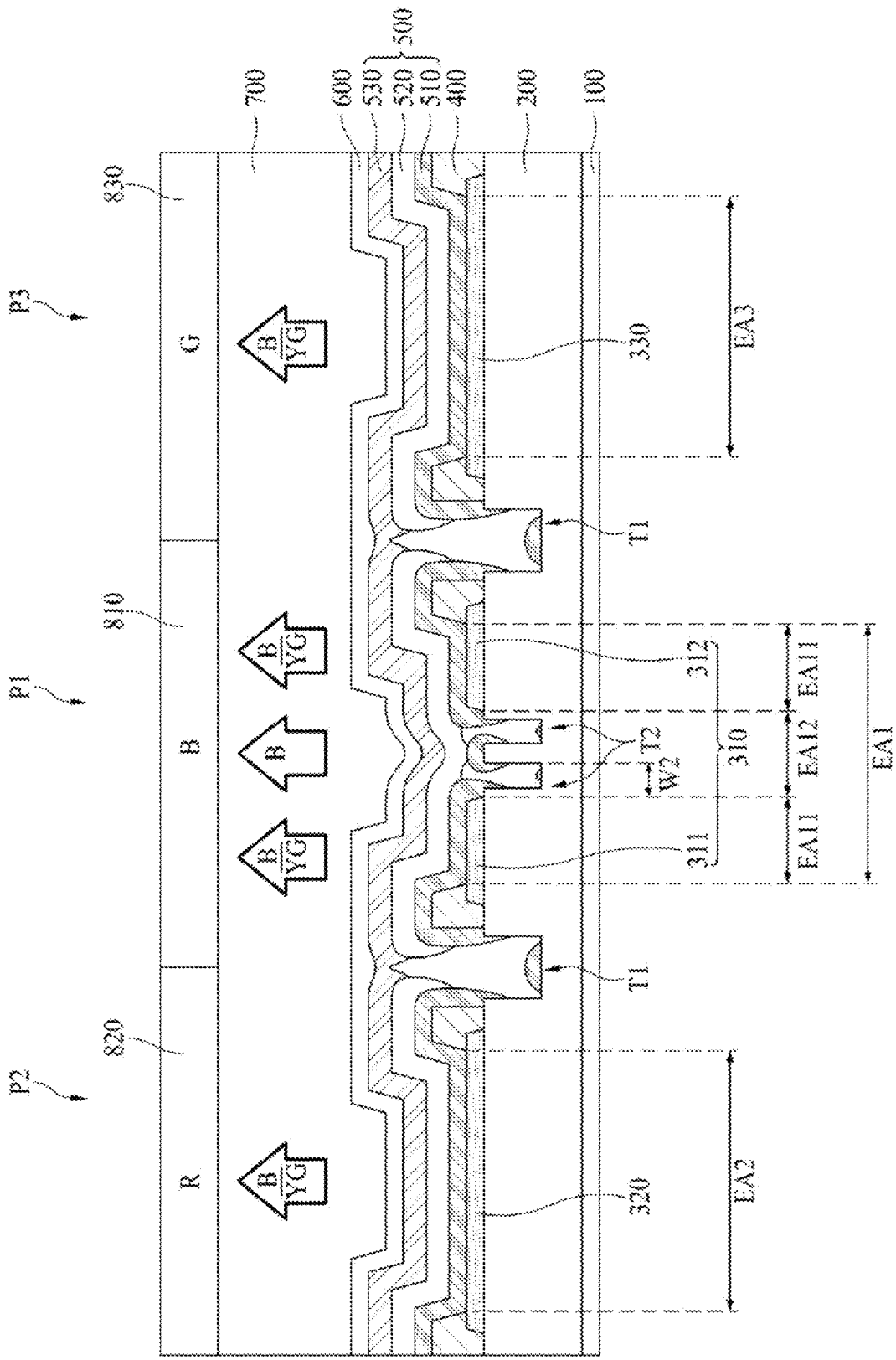
FIG. 4 is a schematic cross sectional view illustrating the electroluminescent display device according to another embodiment of the present disclosure.

FIG. 4 is a schematic cross sectional view illustrating an electroluminescent display device according to another embodiment of the present disclosure. A second trench (T2) is additionally provided in a first sub pixel (P1) of the electroluminescent display device of FIG. 4, whereby the electroluminescent display device of FIG. 4 is different from the electroluminescent display device of FIG. 1. Thus, hereinafter, only the different parts will be described in detail as follows.

Referring to FIG. 4, a second trench (T2) is provided in a first sub pixel (P1). The second trench (T2) may be provided in a circuit device layer 200. In detail, the second trench (T2) may be provided in some areas of an upper portion of the circuit device layer 200, for example, a planarization layer.

As the second trench (T2) is provided in the first sub pixel (P1), an emission layer 500 may be provided in the second trench (T2). The emission layer 500 may be provided inside the second trench (T2), also provided above the second trench (T2).

A first stack 510 of the emission layer 500 may be formed on an inner lateral surface of the second trench (T2), and may be formed on an inner lower surface of the second trench (T2). In this case, some area of the first stack 510 formed on the inner lateral surface of the second trench (T2) is disconnected from some area of the first stack 510 formed on the inner lower surface of the second trench (T2). Thus, some area of the first stack 510 formed on one lateral surface inside the second trench (T2), and more particularly, on the left lateral surface inside the second trench (T2) is not connected with some area of the first stack 510 formed on the other lateral surface inside the second trench (T2), and more particularly, on the right lateral surface inside the second trench (T2). Accordingly, charges are not transferred between a first sub emission area (EA11) and a second sub emission area (EA12), which are disposed adjacent to each other with the second trench (T2) interposed in-between, through the first stack 510.

A charge generation layer 520 of the emission layer 500 may be formed on the first stack 510 in the area overlapped with the second trench (T2). In this case, the charge generation layer 520 may be connectedly provided between the first sub emission area (EA11) and the second sub emission area (EA12) disposed adjacent to each other with the second trench (T2) interposed in-between. Thus, charges may be transferred between the first sub emission area (EA11) and the second sub emission area (EA12), which are disposed adjacent to each other with the second trench (T2) interposed in-between, through the charge generation layer 520.

Also, a second stack 530 may be formed on the charge generation layer 520, and may be connectedly provided between the first sub emission area (EA11) and the second sub emission area (EA12) disposed adjacent to each other with the second trench (T2) interposed in-between. Thus, charges may be transferred between the first sub emission area (EA11) and the second sub emission area (EA12), which are disposed adjacent to each other with the second trench (T2) interposed in-between, through the second stack 530.

Thus, according to another embodiment of the present disclosure, the charges are transferred between the first sub emission area (EA11) and the second sub emission area (EA12), which are disposed adjacent to each other with the second trench (T2) interposed in-between, through the charge generation layer 520 and the second stack 530, however, the charges are not transferred between the first sub emission area (EA11) and the second sub emission area (EA12), which are disposed adjacent to each other with the second trench (T2) interposed in-between, through the first stack 510. Accordingly, blue (B) colored light is emitted from the second stack 520, and yellow green (YG) colored light is not emitted from the first stack 510 by an electric field formed between the charge generation layer 520 and a second electrode 600 in the second sub emission area (EA12), and more particularly, in the area of the second trench (T2).

As described above, in case of the embodiment shown in FIG. 1, as the first electrode 310 is not provided in the second sub emission area (EA12), the electric field is formed between the charge generation layer 520 and the second electrode 600 in the second sub emission area (EA12), whereby only the blue (B) colored light is emitted from the second stack 520. However, in case of the embodiment shown in FIG. 1, the charges are transferred between the first sub emission area (EA11) and the second sub emission area (EA12) through the first stack 510, whereby there is a possibility of partially emitting the yellow green (YG) colored light from the first stack 510 in the second sub emission area (EA12).

Meanwhile, in case of the embodiment shown in FIG. 4, as the second trench (T2) is additionally provided in the second sub emission area (EA12) being in contact with the first sub emission area (EA11), the charges are not transferred between the first sub emission area (EA11) and the second sub emission area (EA12) through the first stack 510, whereby it is possible to prevent the yellow green (YG) colored light from being partially emitted from the first stack 510 of the second sub emission area (EA12).

Also, in case of the embodiment shown in FIG. 4, an emission area of the second stack 520 may be increased owing to the second trench (T2), to thereby improve a luminance.

Two second trenchs (T2) may be respectively provided in the second sub emission area (EA12) being in contact with the first sub emission area (EA11). In detail, one of the second trenchs (T2) having a second width (W2) may extend from one end of the first sub electrode 311 toward the second sub emission area (EA12), and the other of the second trench (T2) having a second width (W2) may extend from one end of the second sub electrode 312, which confronts one end of the first sub electrode 311, toward the second sub emission area (EA12). One end in one of the second trench (T2) may correspond to one end of the first sub electrode 311, and one end in the other of the second trench (T2) may correspond to one end of the second sub electrode 312. As the two of the second trench (T2) are provided, it is possible to prevent the yellow green (YG) colored light of the first stack 510 from being emitted from the second sub emission area (EA12).

Meanwhile, the charge generation layer 520 may be disconnectedly provided in the area of the first trench (T1) disposed in the boundary between the sub pixels (P1, P2, P3), however, the charge generation layer 520 may be connectedly provided in the area of the second trench (T2) disposed in the second sub emission area (EA12) being in contact with the first sub emission area (EA11). To this end, a first width (W1) of the first trench (T1) may be relatively larger than the second width (W2) of the second trench (T2). That is, on the assumption that the first stack 510, the charge generation layer 520, and the second stack 530 are deposited in the area of the trench (T1, T2), a disconnection possibility in the first stack 510, the charge generation layer 520, and the second stack 520 becomes higher when the width (W1, W2) of the trench (T1, T2) becomes larger, and a disconnection possibility in the first stack MO, the charge generation layer 520, and the second stack 520 becomes lower when the width (W1, W2) of the trench (T1, T2) becomes smaller.

Accordingly, the first width (W1) of the first trench (T1) is relatively larger than the second width (W2) of the second trench (T2) so as to disconnectedly provide the charge generation layer 520 in the area of the first trench (T1), and the second width (W2) of the second trench (T2) is relatively smaller than the first width (W1) of the first trench (T1) so as to connectedly provide the charge generation layer 520 in the area of the second trench (T2).

Figure 5:
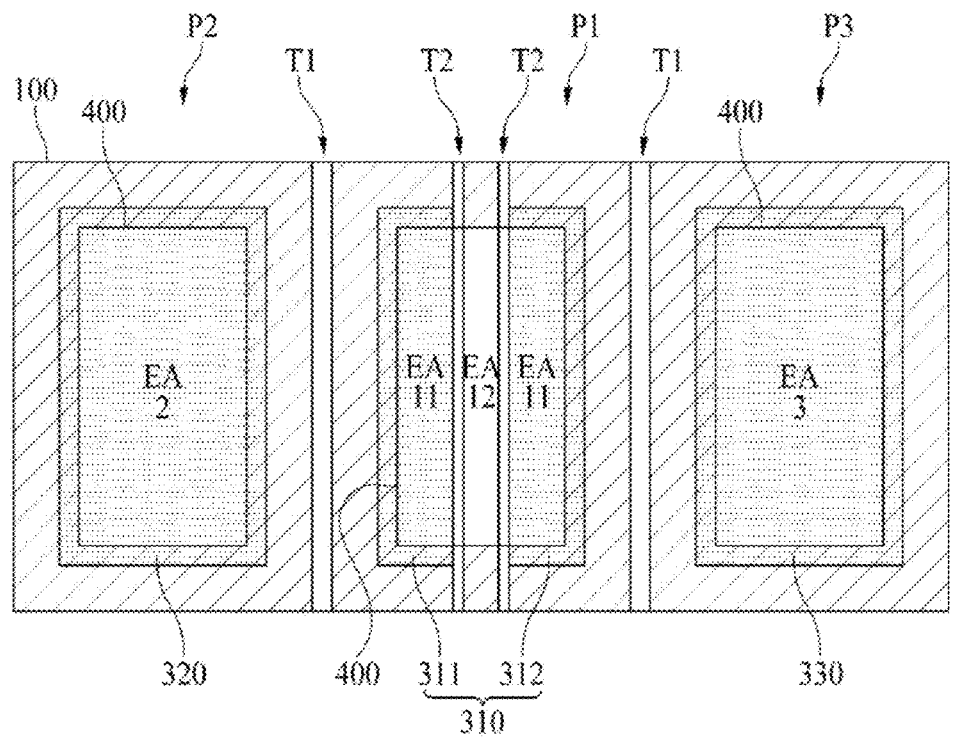
FIG. 5 is a schematic plane view illustrating an electroluminescent display device according to another embodiment of the present disclosure.

FIG. 5 is a schematic plane view illustrating an electroluminescent display device according to another embodiment of the present disclosure. A second trench (T2) is additionally provided in a first sub pixel (P1) of the electroluminescent display device of FIG. 5, whereby the electroluminescent display device of FIG. 5 is different from the electroluminescent display device of FIG. 2. Thus, hereinafter, only the different parts will be described in detail as follows.

As shown in FIG. 5, a second trench (T2) is provided in a first sub pixel (P1). One of the second trench (T2) is formed in a consecutive straight-line shape along an up-and-down direction while being in contact with one end of a first sub electrode 311, and the other of the second trench (T2) is formed in a consecutive straight-line shape along an up-and-down direction while being in contact with one end of a second sub electrode 312 which confronts one end of the first sub electrode 311.

The two of the second trenches (T2) are spaced apart from each other while being parallel to each other.

Figure 6:
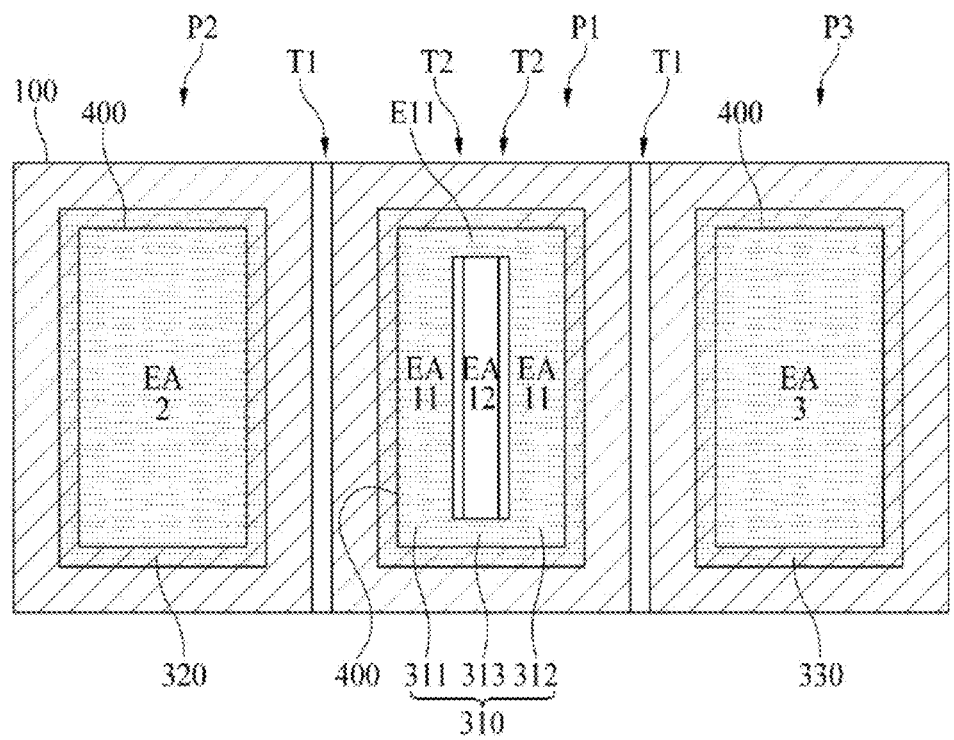
FIG. 6 is a schematic plane view illustrating an electroluminescent display device according to another embodiment of the present disclosure.

FIG. 6 is a schematic plane view illustrating an electroluminescent display device according to another embodiment of the present disclosure. A second trench (T2) is additionally provided in a first sub pixel (P1) of the electroluminescent display device of FIG. 6, whereby the electroluminescent display device of FIG. 6 is different from the electroluminescent display device of FIG. 3. Thus, hereinafter, only the different parts will be described in detail as follows.

As shown in FIG. 6, a second trench (T2) is provided in a first sub pixel (P1). One of the second trench (T2) is extending in an up-and-down direction while being in contact with one end of a first sub electrode 311, and the other of the second trench (T2) is extending in an up-and-down direction while being in contact with one end of a second sub electrode 312 which confronts one end of the first sub electrode 311. The two of the second trenches (T2) are spaced apart from each other while being parallel to each other.

Lower and upper ends of the second trench (T2) are in contact with a third sub electrode 313, whereby the second trench (T2) is not formed in a consecutive straight-line shape unlike the above case of FIG. 5. Meanwhile, although not shown, the second trench (T2) is additionally provided while being in contact with one end of the third sub electrode 313, whereby the second trench (T2) may be formed in a rectangular shape to surround the periphery of a second sub emission area (EA12).

Figure 7:
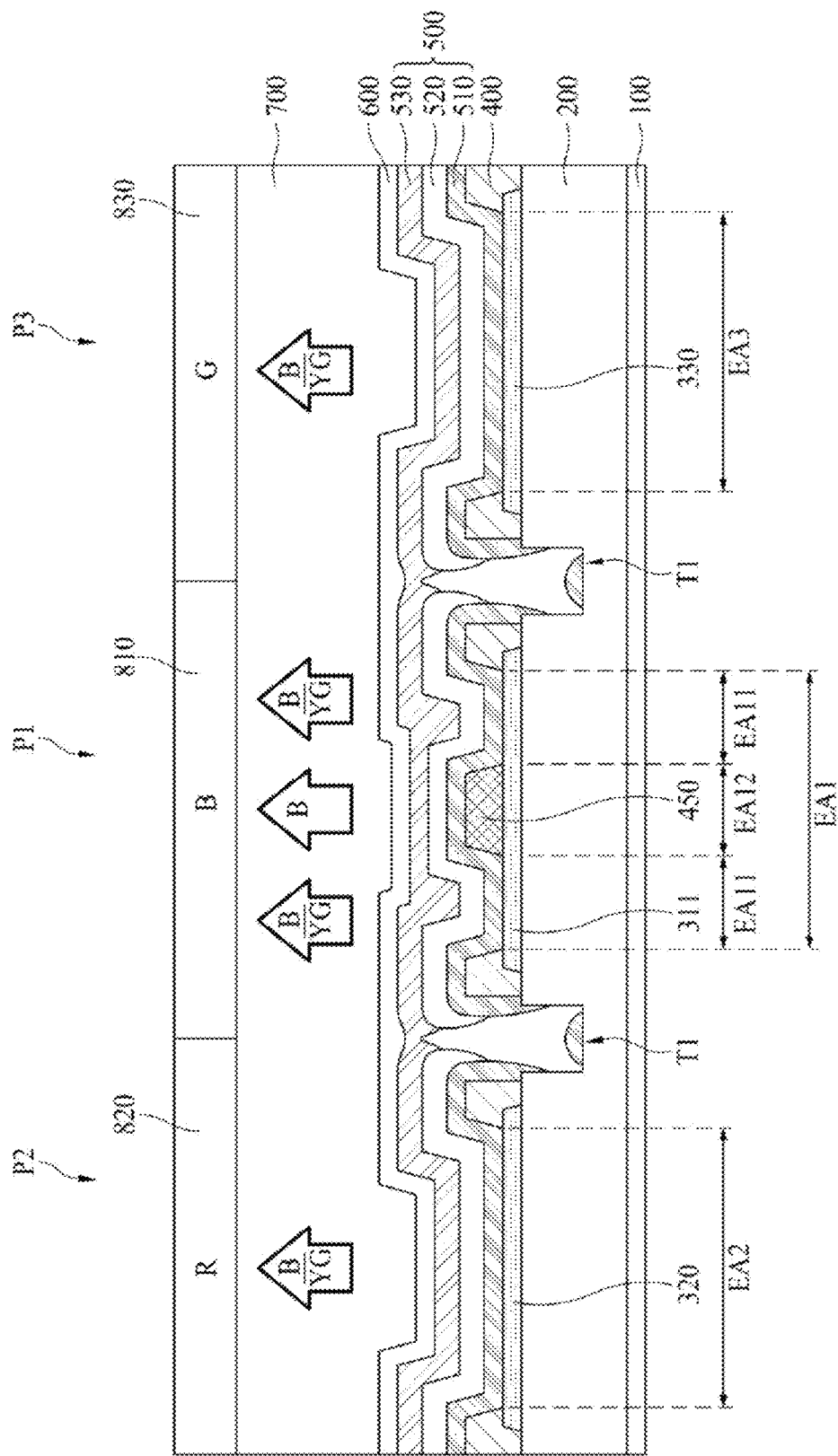
FIG. 7 is a schematic cross sectional view illustrating an electroluminescent display device according to another embodiment of the present disclosure.

FIG. 7 is a schematic cross sectional view illustrating an electroluminescent display device according to another embodiment of the present disclosure.

As shown in FIG. 7, the electroluminescent display device according to another embodiment of the present disclosure includes a substrate 100, a circuit device layer 200, a first electrode 310, 320 and 330, a bank 400, a charge prevention layer 450, an emission layer 500, a second electrode 600, an encapsulation layer 700, and a color filter layer 810, 820 and 830.

The substrate 100, the circuit device layer 200, the bank 400, the emission layer 500, the second electrode 600, the encapsulation layer 700, and the color filter layer 810, 820 and 830 in the electroluminescent display device of FIG. 7 are the same as those of FIG. 1, whereby a detailed description for the same parts will be omitted, and only the different parts will be described in detail as follows.

The first electrode 310, 320 and 330 may include one of the first electrode 310 patterned in a first sub pixel (P1), another first electrode 320 patterned in a second sub pixel (P2), and another first electrode 330 patterned in a third sub pixel (P3). In this case, the first electrode 310 of the first sub pixel (P1) is formed as one body with the first sub pixel (P1), the first electrode 320 of the second sub pixel (P2) is formed as one body with the second sub pixel (P2), and the first electrode 330 of the third sub pixel (P3) is formed as one body with the third sub pixel (P3).

The charge prevention layer 450 is formed on the first electrode 310 of the first sub pixel (P1), and more particularly, is provided while being in contact with an upper surface of the first electrode 310, to thereby prevent an electric field between the first electrode 310 and the second electrode 600. That is, the charge prevention layer 450 prevents charges generated in the first electrode 310, for example, holes from being transferred to an upper side. In other words, the charge prevention layer 450 is formed between the first electrode 310 and the emission layer 500, and more particularly, between the first electrode 310 and a first stack 510 of the emission layer 500 so that it is possible to prevent the holes generated in the first electrode 310 from being transferred to the first stack 510.

The charge prevention layer 450 is not formed on a first area of the first electrode 310, but formed on a second area of the first electrode 310. That is, the charge prevention layer 450 is not overlapped with the first area of the first electrode 310, however, the charge prevention layer 450 is overlapped with the second area of the first electrode 310.

The second area of the first electrode 310 corresponds to the area which is overlapped with the charge prevention layer 450 in the areas which are exposed without being covered by the bank 400. The second area of the first electrode 310 corresponds to the second sub emission area (EA12) in the first emission area (EA11, EA12).

The first area of the first electrode 310 corresponds to the area which is not overlapped with the charge prevention layer 450 in the areas which are exposed without being covered by the bank 400. The first area of the first electrode 310 corresponds to the first sub emission area (EA11) in the first emission area (EA11, EA12).

As the charge prevention layer 450 is not provided in the first sub emission area (EA11) corresponding to the first area of the first electrode 310, an electric field is formed between the first electrode 310 and the second electrode 600, whereby both the first and second stacks 510 and 530 of the emission layer 500 emit light. According to one embodiment of the present disclosure, yellow green (YG) colored light is emitted from the first stack 510 of the emission layer 500, and blue (B) colored light is emitted from the second stack 530 of the emission layer 500. Thus, both the yellow green (YG) colored light and the blue (B) colored light may be emitted from the first sub emission area (EA11) corresponding to the first area of the first electrode 310.

Meanwhile, in the second sub emission area (EA12) corresponding to the second area of the first electrode 310, the charge transfer is prevented by the charge prevention layer 450 so that an electric field is not formed between the first electrode 310 and the second electrode 600. However, a current, which flows in the charge generating layer 520 inside the emission layer 500 of the first sub emission area (EA11), flows into the second sub emission area (EA12), whereby an electric field may be generated between the charge generating layer 520 and the second electrode 600 in the second sub emission area (EA12) corresponding to the second area of the first electrode 310, and thus, the blue (B) colored light may be emitted from the second stack 530 of the emission layer 500. Accordingly, the blue (B) colored light may be emitted from the second stack 520 in the second sub emission area (EA12) corresponding to the second area of the first electrode 310.

According to another embodiment of the present disclosure, the first emission area (EA11, EA12) provided in the first sub pixel (P1) includes the first sub emission area (EA11) configured to emit the light which is the same as the light emitted from the first sub pixel (P1), for example, the blue (B) colored light, together with the light which is different from the light emitted from the first sub pixel (P1), for example, the yellow green (YG) colored light, and also includes the second sub emission area (EA12) configured to emit only the light which is the same as the light emitted from the first sub pixel (P1), for example, the blue (B) colored light. Accordingly, an amount of the light emitted from the first sub pixel (P1) may be increased, to thereby improve a light efficiency.

In other words, according to another embodiment of the present disclosure, the first emission area (EA11, EA12) provided in the first sub pixel (P1) includes the second sub emission area (EA12) configured to emit only the blue (B) colored light. Thus, in comparison to a case in which all the first emission areas (EA11, EA12) emit the blue (B) colored light and the yellow green (YG) colored light, it is possible to improve a light efficiency and color purity.

The charge prevention layer 450 may be formed of the same material as that of the bank 400, and the charge prevention layer 450 may be patterned together with the bank 400 with the same process. Accordingly, a height of the charge prevention layer 450 may be identical to a height of the bank 400, but not necessarily.

Figure 8:
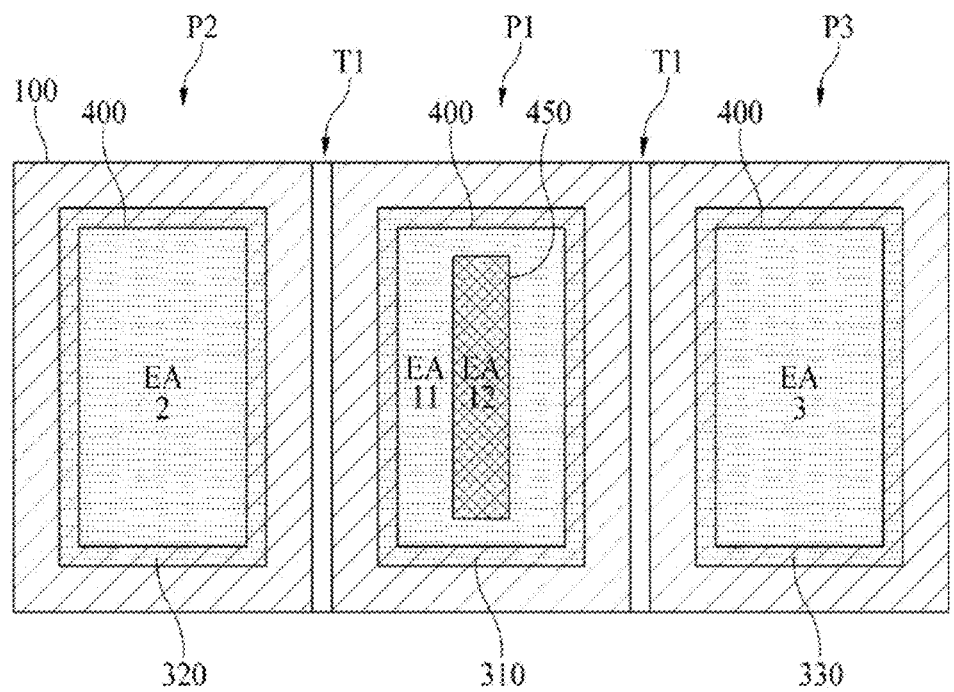
FIG. 8 is a schematic plane view illustrating an electroluminescent display device according to another embodiment of the present disclosure.

FIG. 8 is a schematic plane view illustrating an electroluminescent display device according to another embodiment of the present disclosure.

As shown in FIG. 8, a first sub pixel (P1), a second sub pixel (P2), and a third sub pixel (P3) are provided on a substrate 100, and a first electrode 310, 320 and 330 is patterned in each individual sub pixel (P1, P2, P3).

A bank 400 is configured to cover the periphery of the first electrode 310, 320 and 330, and an emission area (EA11, EA12, E2, E3) is provided in the area of the first electrode 310, 320 and 330 which is not covered by the bank 400.

In detail, the first emission area (EA11, EA12) is provided in the first sub pixel (P1), the second emission area (EA2) is provided in the second sub pixel (P2), and the third emission area (EA3) is provided in the third sub pixel (P3).

Also, a charge prevention layer 450 is provided while being overlapped with the first electrode 310 of the first sub pixel (P1). The charge prevention layer 450 may be formed in the center of the first electrode 310, but not limited to this structure.

The first sub emission area (EA11) is provided in some area which is not overlapped with the charge prevention layer 450 in the area of the first electrode 310 which is not covered by the bank 400, and the second sub emission area (EA12) is provided in some area which is overlapped with the charge prevention layer 450 in the area of the first electrode 310 which is not covered by the bank 400.

As the charge prevention layer 450 is formed in the center of the first electrode 310, the first sub emission area (EA11) is provided to surround the periphery of the second sub emission area (EA12), but not limited to this structure.

Meanwhile, the second emission area (EA2) corresponds to some area which is not overlapped with the bank 400 in the area of the first electrode 320 of the second sub pixel (P2), and the third emission area (EA3) corresponds to some area which is not overlapped with the bank 400 in the area of the first electrode 330 of the third sub pixel (P3).

Also, the bank 400 is provided with a first trench (T1) disposed in the boundary between the first sub pixel (P1) and the second sub pixel (P2), and in the boundary between the second sub pixel (P2) and the third sub pixel (P3).

Figure 9:
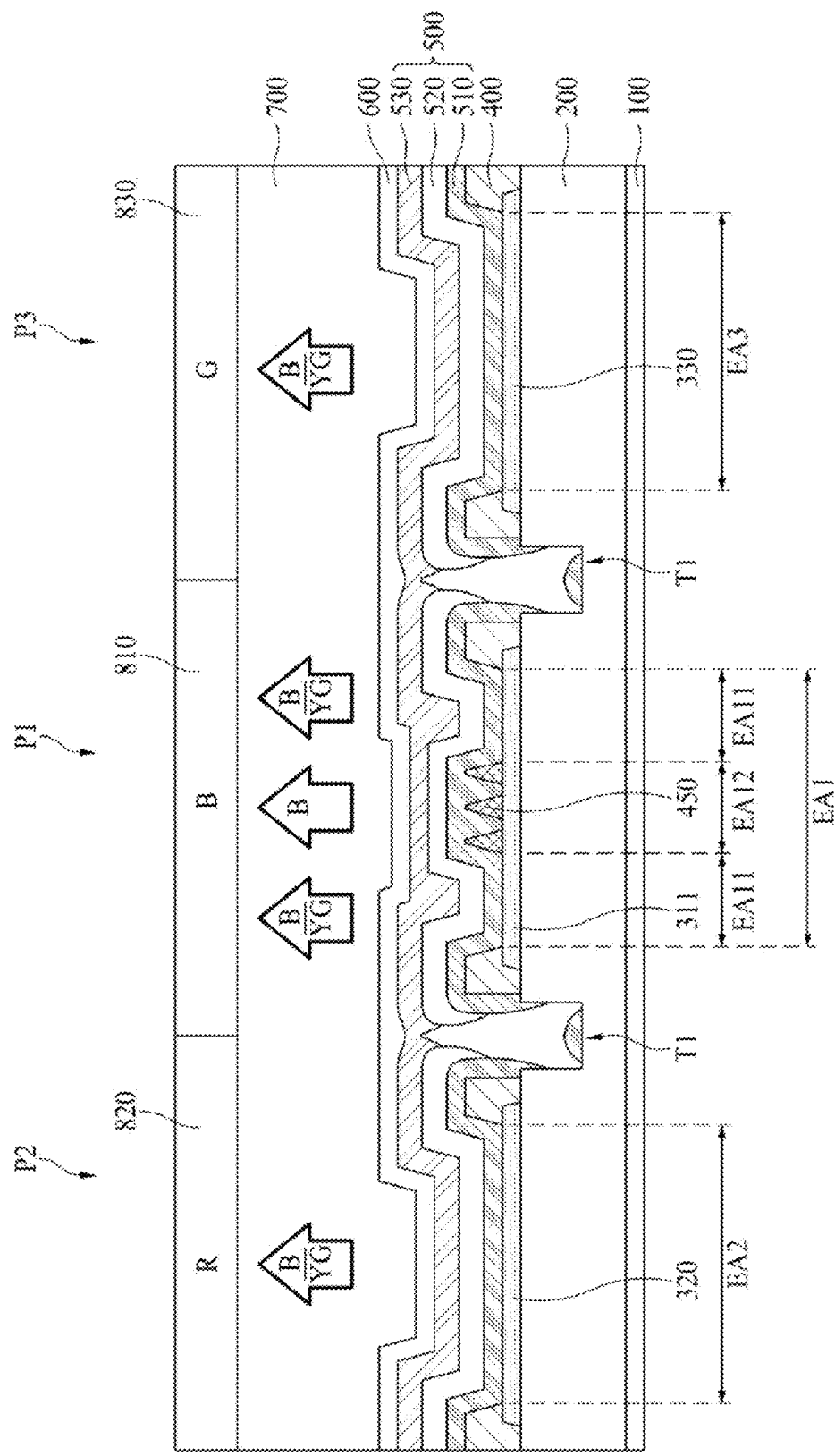
FIG. 9 is a schematic cross sectional view illustrating an electroluminescent display device according to another embodiment of the present disclosure.

FIG. 9 is a schematic cross sectional view illustrating an electroluminescent display device according to another embodiment of the present disclosure. Except that a plurality of charge prevention layers 450 are provided in the electroluminescent display device of FIG. 9, the electroluminescent display device of FIG. 9 is identical in structure to the electroluminescent display device of FIG. 7, whereby only the different parts will be described in detail as follows.

Referring to the above FIG. 7, one charge prevention layer 450 formed as one body is provided between the first electrode 310 and the emission layer 500. Meanwhile, in case of FIG. 9, a plurality of charge prevention layers 450 may be provided between a first electrode 310 and an emission layer 500. The plurality of charge prevention layers 450 are provided at fixed intervals, wherein the plurality of charge prevention layers 450 may be arranged regularly or irregularly.

In case of FIG. 9, the plurality of charge prevention layers 450 are provided at fixed intervals, whereby a plurality of second sub emission areas (EA12) which are overlapped with the plurality of charge prevention layers 450 are provided at fixed intervals, and each first sub emission area (EA11) is provided between each of the plurality of second sub emission areas (EA12).

Figure 10:
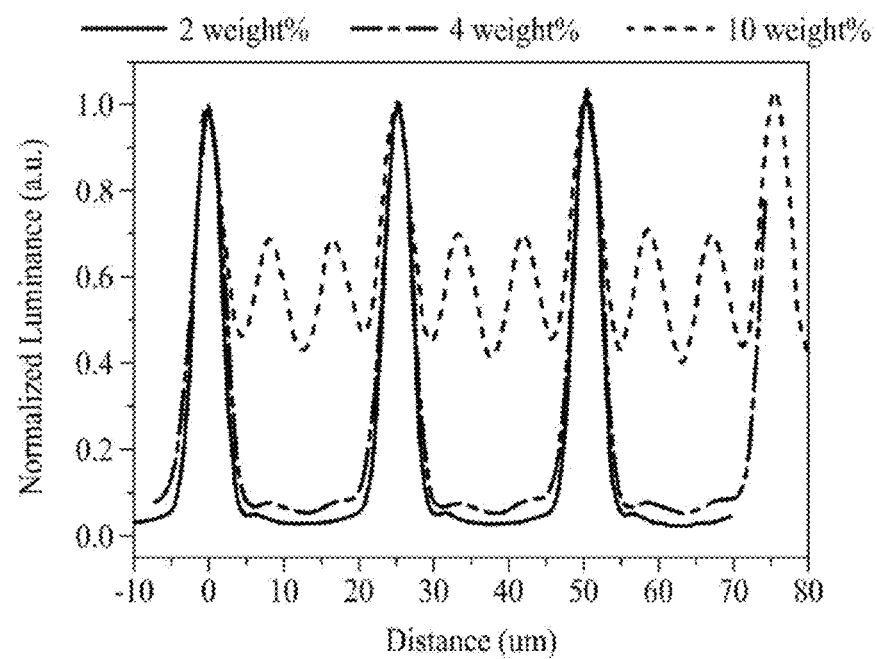
FIG. 10 is a graph illustrating a luminance change in accordance with a metal dopant concentration in an N-type charge generating layer according to one embodiment of the present disclosure.

FIG. 10 is a graph illustrating a luminance change in accordance with a concentration of metal dopant in an N-type charge generation layer according to one embodiment of the present disclosure. FIG. 10 is a graph illustrating a luminance change in a first sub pixel (P1) of the electroluminescent display device of FIG. 9. In FIG. 10, a horizontal direction indicates a position of the first sub pixel (P1), and a vertical direction indicates a normalized luminance.

As shown in FIG. 10, if a concentration of metal dopant in an N-type charge generation layer is 2 weight % and 4 weight %, a luminance deviation is relatively increased in accordance with a position of the first sub pixel (P1). Meanwhile, if a concentration of metal dopant in an N-type charge generation layer is 10 weight %, a luminance deviation is relatively decreased in accordance with a position of the first sub pixel (P1).

Accordingly, it is preferable that a concentration of metal dopant in an N-type charge generation layer is 10 weight % or more than 10 weight % so as to improve a luminance of the first sub pixel (P1).

Figure 11:
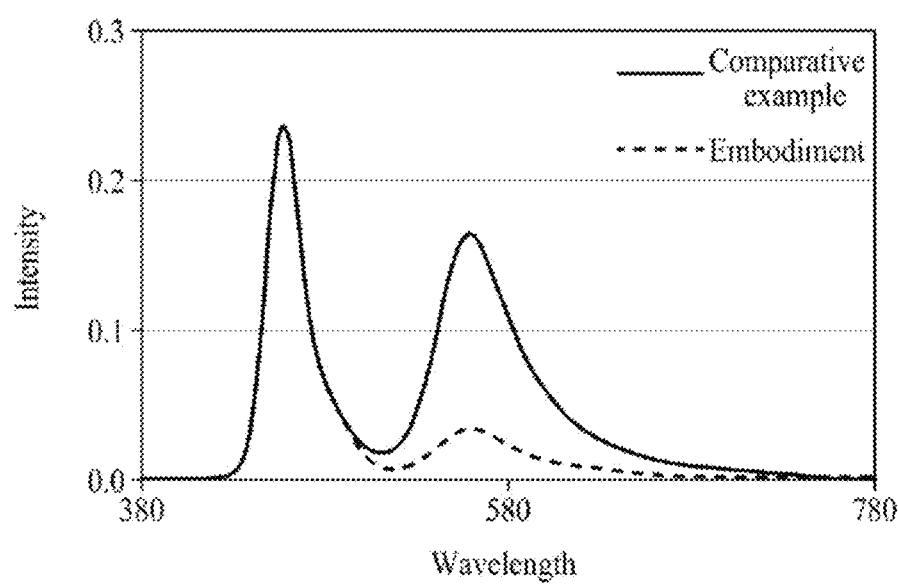
FIG. 11 is a graph illustrating a light intensity by each wavelength range in each of a comparative example and an embodiment of the present disclosure.

FIG. 11 is a graph illustrating a light intensity by each wavelength range in an electroluminescent display device according to a comparative example and the electroluminescent display device according to the embodiment of the present disclosure. The embodiment of the present disclosure of FIG. 11 shows a light intensity by each wavelength range of the first sub pixel (P1) in the electroluminescent display device of FIG. 9, and the comparative example of FIG. 11 shows a light intensity by each wavelength range of the first sub pixel (P1) in the electroluminescent display device obtained by removing a charge prevention layer 450 from the electroluminescent display device of FIG. 9.

As shown in FIG. 11, in case of the comparative example, both a first stack 510 of yellow green (YG) color and a second stack 520 of blue (B) color in the first sub pixel (P1) emit light, whereby a relatively high light intensity is shown in a middle wavelength range of 580 nm. Meanwhile, in case of the embodiment of the present disclosure, a second sub emission area (EA12), in which a light emission is generated only in the second stack 520 of blue (B) color, is provided in the first sub pixel (P1), whereby a relatively low light intensity is shown in a middle wavelength range of 580 nm.

Accordingly, in comparison to the comparative example, the embodiment of the present disclosure shows that an amount of light emitted in a short wavelength range from the first sub pixel (P1) for the blue (B) color is relatively higher than an amount of light emitted in a middle wavelength range from the first sub pixel (P1) for the blue (B) color so that it is possible to improve a color purity of light emitted from the electroluminescent display device according to the embodiment of the present disclosure. Especially, according to experimental results, the comparative example shows that the light emitted from the first sub pixel (P1) has the color coordinates of 'x' corresponding to 0.149 and 'y' corresponding to 0.056, and the embodiment of the present disclosure shows that the light emitted from the first sub pixel (P1) has the color coordinates of 'x' corresponding to 0.144 and 'y' corresponding to 0.042. Accordingly, the color purity of the light in the embodiment of the present disclosure is improved in comparison to the color purity of the light in the comparative example.

Figure 12A:
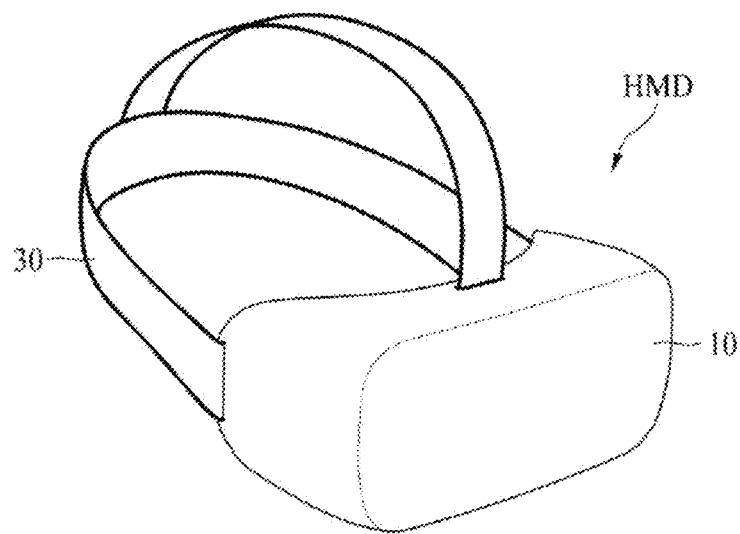
FIGS. 12A to 12C illustrate an electroluminescent display device according to another embodiment of the present disclosure, which relate to a head mounted display (HMD) device.
Figure 12B:
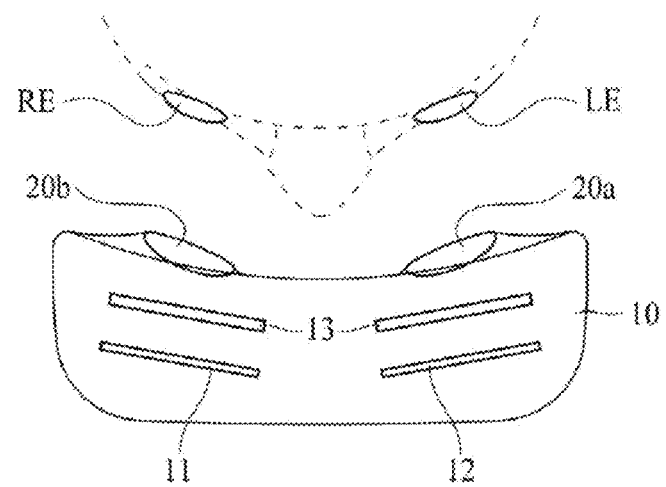
Figure 12C:
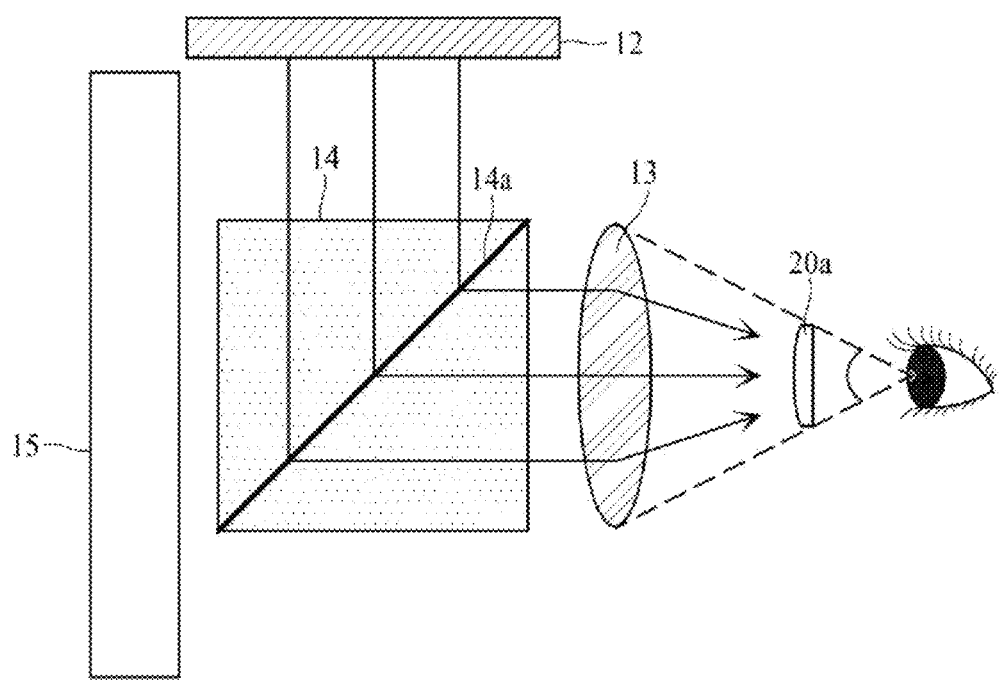

FIGS. 12A to 12C illustrate an electroluminescent display device according to another embodiment of the present disclosure, which relate with a head mounted display (HMD) device. FIG. 12A is a schematic perspective view, FIG. 12B is a schematic plane view of a virtual reality (VR) structure, and FIG. 12C is a schematic cross sectional view of an augmented reality (AR) structure.

As shown in FIG. 12A, the head mounted display (HMD) device according to the present disclosure includes a receiving case 10 and a head mounted band 30.

A display device, a lens array and an ocular eyepiece may be received in the inside of the receiving case 10.

The head mounted band 30 is fixed to the receiving case 10. In the drawings, the head mounted band 30 is configured to surround an upper surface and both lateral surfaces in a user's head, but not limited to this structure. For example, the head mounted band is provided to fix the head mounted display (HMD) device to a user's head, which may be substituted by an eyeglass-frame shape or a helmet-shaped structure.

As shown in FIG. 12B, the head mounted display (HMD) device of the virtual reality (VR) structure according to the present disclosure includes a left-eye display device 12, a right-eye display device 11, a lens array 13, a left-eye ocular eyepiece 20a and a right-eye ocular eyepiece 20b.

The left-eye display device 12, the right-eye display device 11, the lens array 13, and the left-eye ocular eyepiece 20a and the right-eye ocular eyepiece 20b are received in the aforementioned receiving case 10.

The same image may be displayed on the left-eye display device 12 and the right-eye display device 11. In this case, a user can watch a two-dimensional (2D) image. If an image for a left eye is displayed on the left-eye display device 12, and an image for a right eye is displayed on the right-eye display device 11, a user can watch a three-dimensional (3D) image. Each of the left-eye display device 12 and the right-eye display device 11 may be formed of the aforementioned electroluminescent display device shown in FIGS. 1 to 9. In this case, an upper portion corresponding to a surface for displaying an image in FIGS. 1 to 9, for example, the color filter layer 810, 820 and 830 confronts the lens array 13.

The lens array 13 may be disposed between the left-eye ocular eyepiece 20a and the left-eye display device 12 while being apart from each of the left-eye ocular eyepiece 20a and the left-eye display device 12. That is, the lens array 13 may be positioned at the front of the left-eye ocular eyepiece 20a and at the rear of the left-eye display device 12. Also, the lens array 13 may be disposed between the right-eye ocular eyepiece 20b and the right-eye display device 11 while being apart from each of the right-eye ocular eyepiece 20b and the right-eye display device 11. That is, the lens array 13 may be positioned at the front of the right-eye ocular eyepiece 20b and at the rear of the right-eye display device 11.

The lens array 13 may be a micro lens array. The lens array 13 may be substituted by a pin hole array. Owing to the lens array 13, an image displayed on the left-eye display device 12 or the right-eye display device 11 may be expanded and perceived by a user.

A user's left eye (LE) may be positioned at the left-eye ocular eyepiece 20a, and a user's right eye (RE) may be positioned at the right-eye ocular eyepiece 20b.

As shown in FIG. 12C, the head mounted display (HMD) device of the augmented reality (AR) structure according to the present disclosure includes a left-eye display device 12, a lens array 13, a left-eye ocular eyepiece 20a, a transmissive reflecting portion 14 and a transmission window 15. FIG. 12C shows only the left-eye structure, for convenience of explanation. The right-eye structure is identical in structure to the left-eye structure.

The left-eye display device 12, the lens array 13, the left-eye ocular eyepiece 20a, the transmissive reflecting portion 14 and the transmission window 15 are received in the aforementioned receiving case 10.

The left-eye display device 12 may be disposed at one side of the transmissive reflecting portion 14, for example, an upper side of the transmissive reflecting portion 14 without covering the transmission window 15. Accordingly, an image may be provided to the transmissive reflecting portion 14 under the condition that an ambient background seen through the transmission window 15 is not covered by the left-eye display device 12.

The left-eye display device 12 may be formed of the electroluminescent display device shown in FIGS. 1 to 9. In this case, an upper portion corresponding to a surface for displaying an image in FIGS. 1 to 9, for example, the color filter layer 810, 820 and 830 confronts the transmissive reflecting portion 14.

The lens array 13 may be provided between the left-eye ocular eyepiece 20a and the transmissive reflecting portion 14.

A user's left eye is positioned at the left-eye ocular eyepiece 20a.

The transmissive reflecting portion 14 is disposed between the lens array 13 and the transmission window 15. The transmissive reflecting portion 14 may include a reflection surface 14a which partially transmits some of light, and also reflects the remaining light. The reflection surface 14a is configured to guide an image, which is displayed on the left-eye display device 12, toward the lens array 13. Thus, a user can watch an image displayed on the left-eye display device 12 together with the ambient background through the transmission window 15. That is, a user can watch one image obtained by a virtual image overlaid with the ambient real background, to thereby realize an augmented reality (AR).

The transmission window 15 is disposed in front of the transmissive reflecting portion 14.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display device, comprising:
   a substrate including a first sub pixel, a second sub pixel, and a third sub pixel;
   a first electrode in each of the first to third sub pixels on the substrate;
   an emission layer on the first electrode;
   a second electrode on the emission layer; and
   a blue color filter in the first sub pixel,
   wherein the first sub pixel is provided with a first emission area including a first sub emission area and a second sub emission area,
   the first sub emission area is configured to emit mixed light of first colored light and second colored light, wherein the second colored light is different from the first colored light, and the second sub emission area is configured to emit the second colored light, and
   the blue color filter overlaps the first sub emission area and the second sub emission area and is configured to transmit the second colored light and block the first colored light.

2. The electroluminescent display device according to claim 1,
   wherein the emission layer includes a first stack configured to emit the first colored light, a second stack configured to emit the second colored light, and a charge generation layer disposed between the first stack and the second stack, and
   the first sub emission area is configured to emit light from the first stack and the second stack, and the second sub emission area is configured to emit light from the second stack.

3. The electroluminescent display device according to claim 2, wherein the first sub emission area and the second sub emission area are configured such that a current flowing in the charge generation layer of the first sub emission area is transferred to the charge generation layer of the second sub emission area, and an electric field is formed between the second electrode and the charge generation layer in the second sub emission area.

4. The electroluminescent display device according to claim 3, wherein the charge generation layer includes an N-type charge generation layer configured to transfer the current, and the N-type charge generation layer includes dopant of 10 weight % to 15 weight %.

5. The electroluminescent display device according to claim 1,
   wherein the first electrode provided in the first sub pixel includes a first sub electrode and a second sub electrode spaced apart from each other, and
   the first sub electrode and the second sub electrode are overlapped with the first sub emission area, and the spaced area between the first sub electrode and the second sub electrode is overlapped with the second sub emission area.

6. The electroluminescent display device according to claim 5, wherein the first sub electrode and the second sub electrode are separated from each other with respect to the center of the second sub emission area.

7. The electroluminescent display device according to claim 5, wherein the first electrode provided in the first sub pixel includes an additional third sub electrode configured to connect the first sub electrode and the second sub electrode with each other, and the third sub electrode is overlapped with the first sub emission area.

8. The electroluminescent display device according to claim 5, further comprising a circuit device layer below the first electrode, and a trench provided in the circuit device layer of the second sub emission area, wherein the emission layer is provided in the trench.

9. The electroluminescent display device according to claim 8,
   wherein the emission layer includes a first stack configured to emit the first colored light, a second stack configured to emit the second colored light, and a charge generation layer disposed between the first stack and the second stack, and
   the first stack is disconnectedly provided in the trench, and the charge generation layer and the second stack are connectedly provided in the area overlapped with the trench.

10. The electroluminescent display device according to claim 8, wherein the trench includes one trench being in contact with one end of the first sub electrode, and another trench being in contact with one end of the second sub electrode.

11. The electroluminescent display device according to claim 1, further comprising a charge prevention layer provided between the emission layer and the first electrode of the first sub pixel, and configured to prevent charges generated in the first electrode from being transferred to the emission layer,
    wherein the first sub emission area is not overlapped with the charge prevention layer, and the second sub emission area is overlapped with the charge prevention layer.

12. The electroluminescent display device according to claim 11, wherein a plurality of charge prevention layers are provided while being apart from each other on the first electrode.

13. The electroluminescent display device according to claim 11, further comprising a bank configured to cover the periphery of the first electrode,
    wherein the charge prevention layer is formed of the same material as that of the bank, and is provided with the same height as that of the bank.

14. The electroluminescent display device according to claim 1, wherein the first colored light is different from the light emitted from the first sub pixel, and the second colored light is the same as the light emitted from the first sub pixel.

15. The electroluminescent display device according to claim 1, further comprising a trench provided in the boundary between each of the first to third sub pixels,
    wherein at least some of the emission layer is disconnectedly provided in the area overlapped with the trench.

16. The electroluminescent display device according to claim 1, further comprising a lens array spaced apart from the substrate, and a receiving case configured to receive the substrate and the lens array therein.

* * * * *